US011469748B2

(12) United States Patent
Chung

(10) Patent No.: US 11,469,748 B2
(45) Date of Patent: Oct. 11, 2022

(54) LATCH CIRCUIT AND SENSING AMPLIFIER

(71) Applicant: Realtek Semiconductor Corporation, Hsinchu (TW)

(72) Inventor: Yu-Ting Chung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/347,725

(22) Filed: Jun. 15, 2021

(65) Prior Publication Data

US 2022/0271744 A1    Aug. 25, 2022

(30) Foreign Application Priority Data

Feb. 25, 2021  (TW) .................................. 110106654

(51) Int. Cl.
*H03K 5/24* (2006.01)
*H03K 3/356* (2006.01)
*G11C 7/06* (2006.01)
*H03K 19/20* (2006.01)

(52) U.S. Cl.
CPC .............. *H03K 5/249* (2013.01); *G11C 7/06* (2013.01); *G11C 7/065* (2013.01); *H03K 3/356113* (2013.01); *H03K 19/20* (2013.01)

(58) Field of Classification Search
CPC combination set(s) only.
See application file for complete search history.

(56) References Cited

U.S. PATENT DOCUMENTS

| 9,559,674 B2* | 1/2017 | Ho ...................... H03M 1/0872 |
| 2001/0026181 A1 | 10/2001 | Nishimura et al. |
| 2016/0336927 A1* | 11/2016 | Ho ...................... H03M 1/0872 |

* cited by examiner

*Primary Examiner* — Long Nguyen
(74) *Attorney, Agent, or Firm* — Locke Lord LLP; Tim Tingkang Xia, Esq.

(57) ABSTRACT

A first current source and a third current source are coupled at a first output node. A second current source and a fourth current source are coupled at a second output node. Control terminals of a first transistor and a second transistor are coupled to the second output node. Control terminals of a third transistor and a fourth transistor are coupled to the first output node. The first transistor and a fifth transistor are coupled in series between a power terminal and the first output node. A sixth transistor and the second transistor are coupled in series between the first output node and a ground terminal. The third transistor and a seventh transistor are coupled in series between the power terminal and the second output node. An eighth transistor and the fourth transistor are coupled in series between the second output node and the ground terminal.

17 Claims, 8 Drawing Sheets

LATCH CIRCUIT AND SENSING AMPLIFIER

RELATED APPLICATIONS

This application claims priority to Taiwan Application Serial Number 110106654, filed Feb. 25, 2021, which is herein incorporated by reference.

BACKGROUND

Technical Field

The present disclosure relates to a latch circuit and a sensing amplifier. More particularly, the present disclosure relates to a latch circuit and a sensing amplifier which have better performance.

Description of Related Art

With developments of circuit technology, latch circuits and sensing amplifiers are applied in various circuitries. However, in some related arts, short currents are generated in latch circuits during signal transitions. In addition, in some related arts, the sensing amplifiers have kickback noise problems.

SUMMARY

Some aspects of the present disclosure are to provide a latch circuit. The latch circuit includes a first current source, a second current source, a third current source, a fourth current source, a first transistor, a second transistor, a third transistor, a fourth transistor, a fifth transistor, a sixth transistor, a seventh transistor, and an eighth transistor. The first current source and the third current source are coupled at a first output node. The second current source and the fourth current source are coupled at a second output node. A control terminal of the first transistor and a control terminal of the second transistor are coupled to the second output node. A control terminal of the third transistor and a control terminal of the fourth transistor are coupled to the first output node. The first transistor and the fifth transistor are coupled in series between a power terminal and the first output node. The sixth transistor and the second transistor are coupled in series between the first output node and a ground terminal. The third transistor and the seventh transistor are coupled in series between the power terminal and the second output node. The eighth transistor and the fourth transistor are coupled in series between the second output node and the ground terminal. The fifth transistor, the sixth transistor, the seventh transistor, and the eighth transistor are turned on or turned off based on a clock signal.

Some aspects of the present disclosure are to provide a sensing amplifier. The sensing amplifier includes a first comparator circuit, a logic circuit, and a latch. The first comparator circuit is configured to generate a first comparison signal and a second comparison signal according a first input signal, a second input signal, and a first clock signal. The logic circuit is configured to generate a first control signal, a second control signal, a third control signal, and a fourth control signal based on the first clock signal, the first comparison signal, and the second comparison signal. The latch circuit includes a first current source, a second current source, a third current source, a fourth current source, a first transistor, a second transistor, a third transistor, and a fourth transistor. The first current source and the third current source are coupled at a first output node. The first control signal is configured to control the first current source, and the third control signal is configured to control the third current source. The second current source and the fourth current source are coupled at a second output node. The second control signal is configured to control the second current source, and the fourth control signal is configured to control the fourth current source. A control terminal of the first transistor and a control terminal of the second transistor are coupled to the second output node. A control terminal of the third transistor and a control terminal of the fourth transistor are coupled to the first output node.

Based on the descriptions above, the present disclosure can prevent the latch circuit from generating the short current during signal transitions. In addition, the sensing amplifier can improve performance by using kickback noise. Accordingly, the latch circuit and the sensing amplifier of the present disclosure have better performance.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
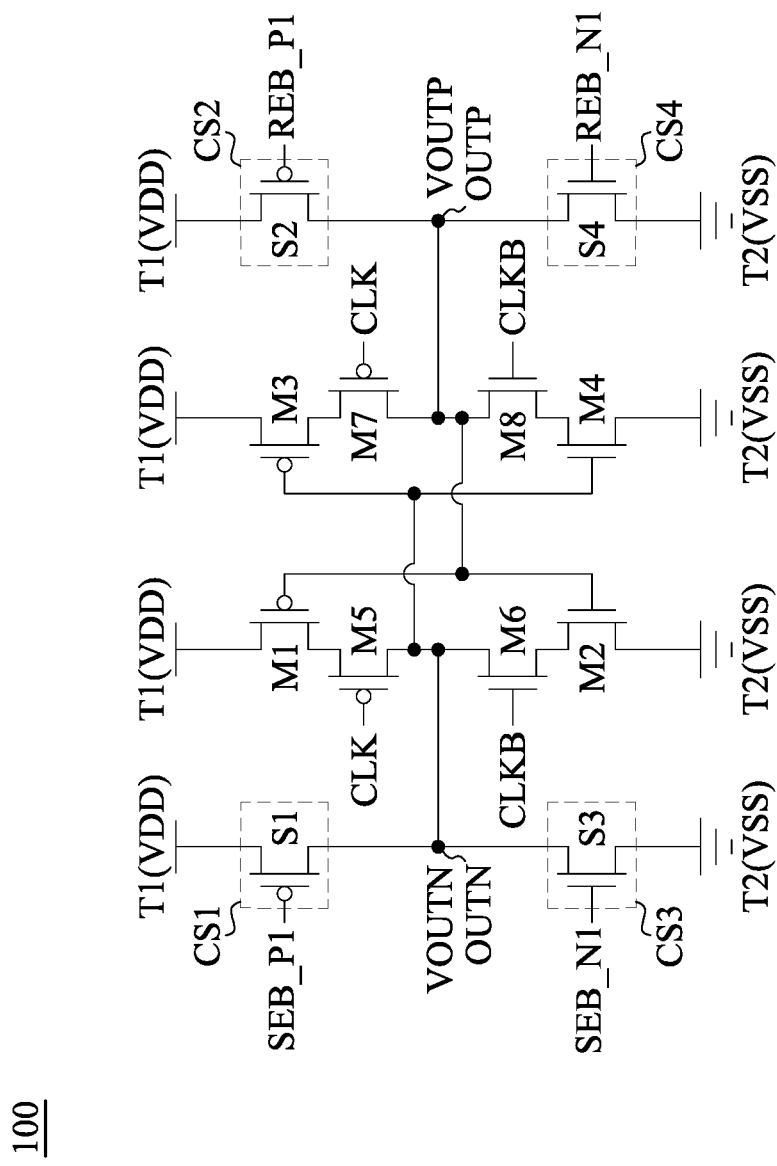
FIG. 1 is a schematic diagram illustrating a latch circuit according to some embodiments of the present disclosure.

Reference is made to FIG. 1. FIG. 1 is a schematic diagram illustrating a latch circuit 100 according to some embodiments of the present disclosure. The latch circuit 100 includes current sources CS1-CS4 and transistors M1-M8. The current sources CS1-CS4 are implemented by switches S1-S4 respectively, but the present disclosure is not limited thereto.

As illustrated in FIG. 1, the transistor M1, the transistor M3, the transistor M5, and the transistor M7 are P-type transistors, and the transistor M2, the transistor M4, the transistor M6, and the transistor M8 are N-type transistors. The switch S1 and the switch S2 are P-type switches (e.g., P-type transistors), and the switch S3 and the switch S4 are N-type switches (e.g., N-type transistors).

The current source CS1 and the current source CS3 are coupled at an output node OUTN. An output voltage VOUTN is generated at the output node OUTN. The current source CS2 and the current source CS4 are coupled at an output node OUTP. An output voltage VOUTP is generated at the output node OUTP. A control terminal of the transistor M1 and a control terminal of the transistor M2 are coupled to the output node OUTP. A control terminal of the transistor M3 and a control terminal of the transistor M4 are coupled to the output node OUTN. The transistor M1 and the transistor M5 are coupled in series between a power terminal T1 and the output node OUTN. The power terminal T1 is configured to receive a power voltage VDD. The transistor M6 and the transistor M2 are coupled in series between the output node OUTN and a ground terminal T2. The ground terminal T2 is configured to receive a ground voltage VSS. The transistor M3 and the transistor M7 are coupled in series between the power terminal T1 and the output node OUTP. The transistor M8 and the transistor M4 are coupled in series between the output node OUTP and the ground terminal T2.

The switch S1 is controlled by a control signal SEB_P1 to be turned on or turned off. The switch S2 is controlled by a control signal REB_P1 to be turned on or turned off. The switch S3 is controlled by a control signal SEB_N1 to be turned on or turned off. The switch S4 is controlled by a control signal REB_N1 to be turned on or turned off.

The transistor M5, the transistor M6, the transistor M7, and the transistor M8 are turned on or turned off based on a clock signal CLK. For example, control terminals of the transistor M5 and the transistor M7 are configured to receive the clock signal CLK, and the transistor M5 and the transistor M7 are turned on or turned off according to the clock signal CLK. Control terminals of the transistor M6 and the transistor M8 are configured to receive an inversion clock signal CLKB, and the transistor M6 and the transistor M8 are turned on or turned off according to the inversion clock signal CLKB.

In some related arts, latch circuits are designed without the transistors M5-M8. Accordingly, during signal transitions (e.g., voltage levels of signals changes from a higher voltage level to a lower voltage level), some transistors in these latch circuits (e.g., transistors corresponding to the transistor M1 and the transistor M2 of the present disclosure) are slightly turned on for a short period of time. Accordingly, a short current will be generated on a path of these transistors. Similarly, other transistors (e.g., transistors corresponding to the transistor M3 and the transistor M4 of the present disclosure) may share the same problem.

In addition, in some related arts, during the level transition of output voltages (e.g., a voltage level corresponding to the output voltage VOUTP of the present disclosure changes from a higher voltage level to a lower voltage level, or a voltage level corresponding to the output voltage VOUTN of the present disclosure changes from a lower voltage level to a higher voltage level), some current sources (e.g., current sources corresponding to the current source CS1 and the current source CS4 of the present disclosure) are turned on first, and thus a short current is generated on a path of some transistors (e.g., transistors corresponding to the transistor M2 and the transistor M3 of the present disclosure). Then, when the voltage level of output voltages changes completely, these transistors (e.g., the transistors corresponding to the transistor M2 and the transistor M3 of the present disclosure) are turned off.

Compared to the aforementioned related arts, the latch circuit 100 of the present disclosure is designed with the transistor M5-M8. Accordingly, when the clock signal CLK has a higher voltage level (the inversion clock signal CLKB has a lower voltage level), control signals control the current sources to be turned on such that the levels of the signals change. In this case, since the transistors M5-M8 are turned off, there is no short current. When the clock signal CLK has a lower voltage level (the inversion clock signal CLKB has a higher voltage level), the control signals controls the current sources to be turned off. In this case, since the transistors M5-M8 are turned on, the latch circuit enters a latched state.

In some other embodiments, a position of the transistor M1 and a position of the transistor M5 can be exchanged, a position of the transistor M2 and a position of the transistor M6 can be exchanged, a position of the transistor M3 and a position of the transistor M7 can be exchanged, or a position of the transistor M4 and a position of the transistor M8 can be exchanged.

Figure 2:
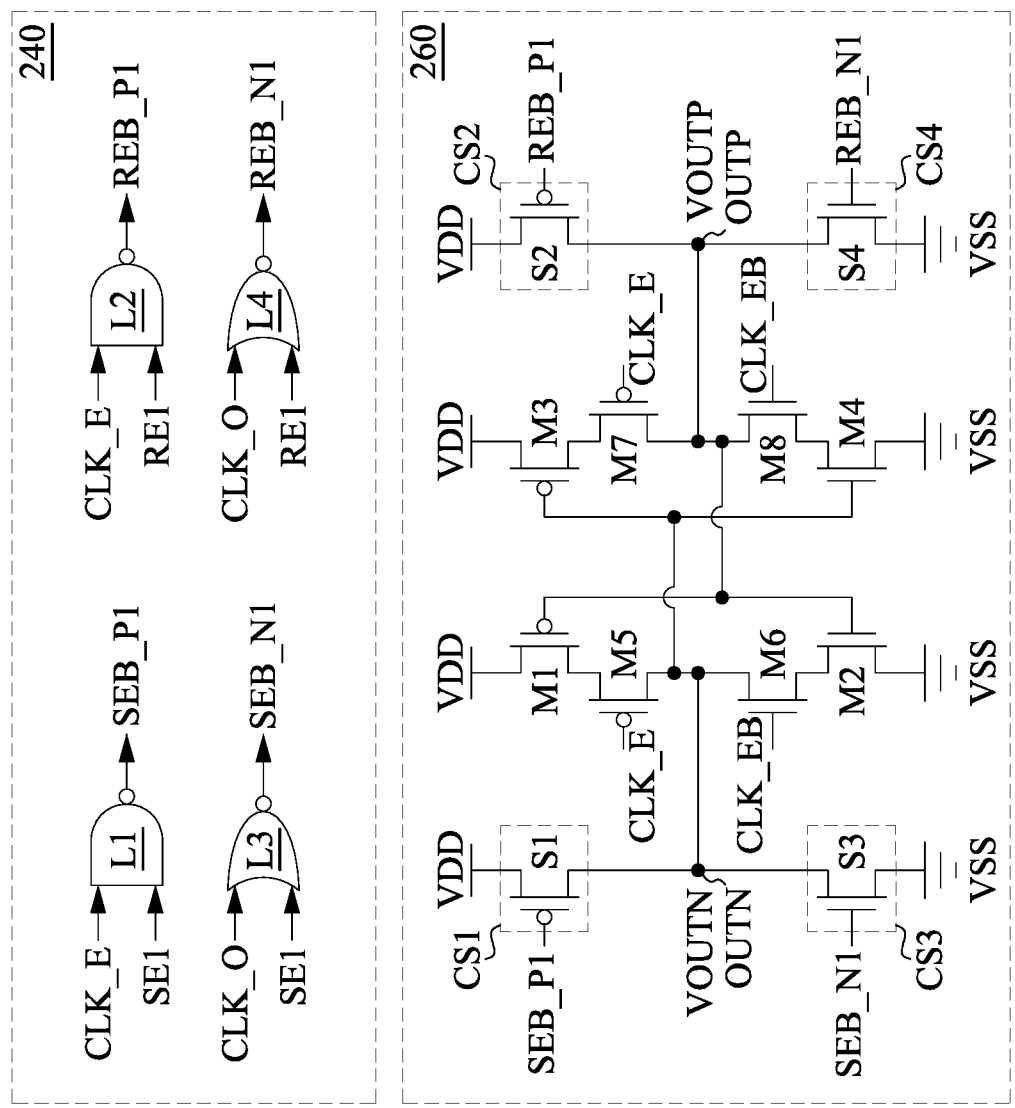
FIG. 2 is a schematic diagram illustrating a sensing amplifier according to some embodiments of the present disclosure.

Reference is made to FIG. 2. FIG. 2 is a schematic diagram illustrating a sensing amplifier 200 according to some embodiments of the present disclosure. As illustrated in FIG. 2, the sensing amplifier 200 includes a comparator circuit 220, a logic circuit 240, and a latch circuit 260. In some embodiments, the sensing amplifier 200 can operate in a full-rate mode.

The comparator circuit 220 operates according to a clock signal CLK_E, an input signal IN1, an input signal IN2, the power voltage VDD, and the ground voltage VSS to generate a comparison signal SE1 and a comparison signal RE1.

For example, when the clock signal CLK_E falls to a logic value 0, the comparator circuit 220 is in a reset state. In this case, the comparison signal SE1 and the comparison signal RE1 have a logic value 1. When the clock signal CLK_E rises to a logic value 1, the comparator circuit 220 is in a comparison state and can compare the input signal IN1 and the input signal IN2. When the input signal IN1 is greater than the input signal IN2, the comparison signal SE1 has a logic value 0 and the comparison signal RE1 has a logic value 1.

The logic circuit 240 is configured to generate the control signal SEB_P1, the control signal REB_P1, the control signal SEB_N1, and the control signal REB_N1 based on the clock signal CLK_E, a clock signal CLK_O, the comparison signal SE1, and the comparison signal RE1. As described above, the sensing amplifier 200 can operate in the full-rate mode. When the sensing amplifier 200 operates in the full-rate mode, the clock signal CLK_O has a logic value 0.

As illustrated in FIG. 2, the logic circuit 240 includes a logic gate L1, a logic gate L2, a logic gate L3, and a logic gate L4. The logic gate L1 and the logic gate L2 are NAND gates, and the logic gate L3 and the logic gate L4 are NOR gates. The logic gate L1 is configured to perform the NAND operation on the clock signal CLK_E and the comparison signal SE1 from the comparator circuit 220 to generate the control signal SEB_P1. The logic gate L2 is configured to perform the NAND operation on the clock signal CLK_E and the comparison signal RE1 from the comparator circuit 220 to generate the control signal REB_P1. The logic gate L3 is configured to perform the NOR operation on the clock signal CLK_O and the comparison signal SE1 from the comparator circuit 220 to generate the control signal SEB_N1. The logic gate L4 is configured to perform the NOR operation on the clock signal CLK_O and the comparison signal RE1 from the comparator circuit 220 to generate the control signal REB_N1. The present disclosure is not limited to the example illustrated in FIG. 2. As described above, in some embodiments (e.g., under a condition that the sensing amplifier 200 operates in the full-rate mode), the logic gate L3 can be replaced by an inverter to receive the comparison signal SE1 from the comparator circuit 220, and the logic gate L4 can be replaced by another inverter to receive the comparison signal RE1 from the comparator circuit 220.

The implementation of the latch circuit 260 in FIG. 2 is similar to that of the latch circuit 100 in FIG. 1 (e.g., the clock signal CLKE and an inversion clock signal CLK EB in FIG. 2 correspond to the clock signal CLK and the inversion clock signal CLK_B in FIG. 1 respectively). The control signal SEB_P1, the control signal REB_P1, the control signal SEB_N1, and the control signal REB_N1 generated by the logic circuit 240 are configured to control the switch S1, the switch S2, the switch S3, and the switch S4 in the latch circuit 260 respectively.

Figure 3:
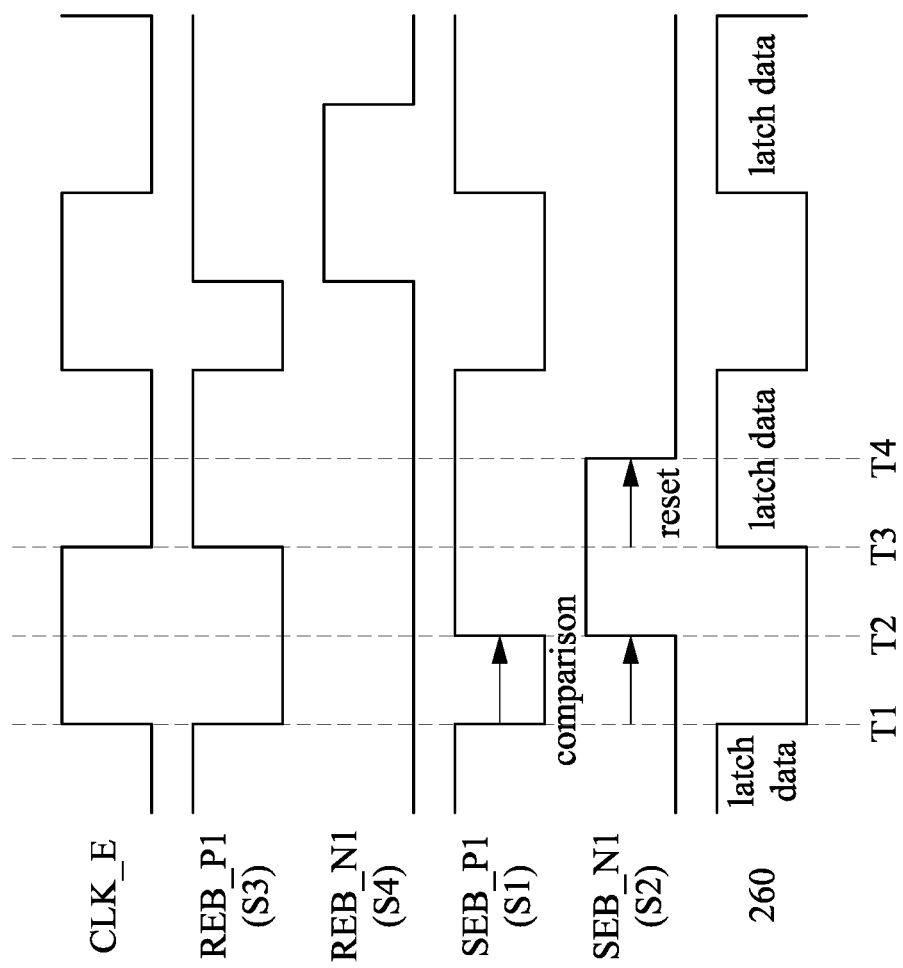
FIG. 3 is a waveform diagram illustrating signals in FIG. 2 according to some embodiments of the present disclosure.

Reference is made to FIG. 3. FIG. 3 is a waveform diagram illustrating signals in FIG. 2 according to some embodiments of the present disclosure.

Before a timing point T1, as described above, when the clock signal CLK_E has a logic value 0, the comparator circuit 220 is in the reset state and the comparison signals SE1 and RE1 have a logic value 1. In this case; the control signal SEB_P1 and the control signal REB_P1 have a logic value 1. Accordingly, the switch S1 and the switch S2 are turned off. As described above, when the sensing amplifier 200 operates in the full-rate mode, the clock signal CLK_O has a logic value 0. The control signal SEB_N1 and the control signal REB_N1 have a logic value 0 since the clock signal CLK_O has a logic value 0 and the comparison signals SE1 and RE1 have a logic value 1. Accordingly, the switch S3 and the switch S4 are turned off. In this case, the latch circuit 260 can latch the data.

At the timing point T1, when the clock signal CLK_E rises to a logic value 1, the comparator circuit 220 enters the comparison state and the comparison signals SE1 and RE1 still have a logic value 1. In this case, the control signal SEB_P1 and the control signal REB_P1 have a logic value 0. Accordingly, the switch S1 and the switch S2 are turned on. The control signal SEB_N1 and the control signal REB_N1 still have a logic value 0. Accordingly, the switch S3 and the switch S4 are turned off. Since the switches S1-S2 are turned on and the switches S3-S4 are turned off, the output voltage VOUTN and the output voltage VOUTP are pulled up according to the power voltage VDD.

After a period of comparison time, the comparison signal SE1 generated by the comparator circuit 220 has a logic value 0 and the comparison signal RE1 generated by the comparator circuit 220 has a logic value 1. In this case (e.g., a timing point T2), the control signal SEB_P1 has a logic value 1 and the control signal REB_P1 has a logic value 0. Accordingly, the switch S1 is turned off and the switch S2 is still on. The control signal SEB_N1 has a logic value 1 and the control signal REB_N1 has a logic value 0. Accordingly, the switch S3 is turned on and the switch S4 is still off. In other words, the output voltage VOUTN is pulled down according to the ground voltage VSS, and the output voltage VOUTP is still pulled up according to the power voltage VDD.

Then (e.g., a timing point T3), the clock signal CLK_E falls again and falls to a logic value 0, the comparator circuit 220 enters the reset state again, the comparison signal SE1 still has a logic value 0, and the comparison signal RE1 still has a logic value 1. In this case, the control signal SEB_P1 and the control signal REB_P1 have a logic value 1. Accordingly, the switch S1 is still off and the switch S2 is turned off. After a period of reset time, the comparison signal SE1 and the comparison signal RE1 generated by the comparator circuit 220 have a logic value 1. At this moment (e.g., a timing point T4), the control signal SEB_N1 and the control signal REB_N1 have a logic value 0. Accordingly, the switch S3 is turned off and the switch S4 is still off, the latch circuit 260 enters the latched state.

In general, sensing amplifiers in prior arts suffer kickback noise. In some related arts, multi-stage (e.g., two-stage) inverters are used to generate control signals to control current sources so as to avoid the kickback noise. However, due to the multi-stage inverters, too much delay is introduced into signals. In addition, in some related arts, these control signals require a period of reset time before the switches of the current sources can be turned off.

Compared to the aforementioned related arts, the sensing amplifier 200 of the present disclosure uses the NAND gates and the NOR gates to generate the control signals for controlling the current source CS1-CS4. With this method, the kickback noise can be used to improve performance without introducing unacceptable delay into the signals. In addition, in the present disclosure, when the clock signal CLK_E drops (e.g., the timing point T3), a voltage level of the control signal REB_P1 is pulled up immediately. Thus, the switch S2 of the current source CS2 is turned off immediately without the aforementioned reset time.

Figure 4A:
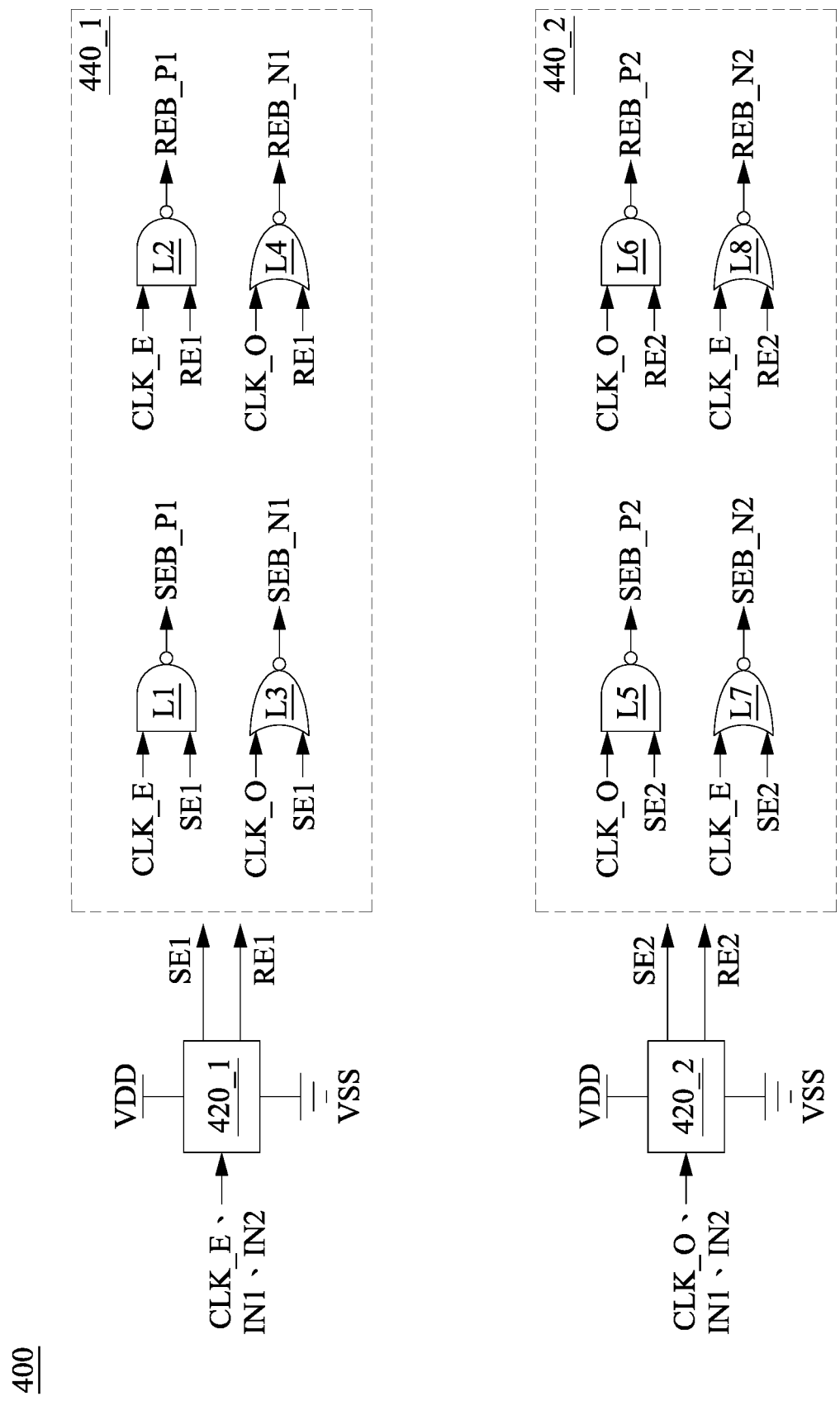
FIG. 4A is a schematic diagram illustrating two comparator circuits and two logic circuits of a sensing amplifier according to some embodiments of the present disclosure.
Figure 4B:
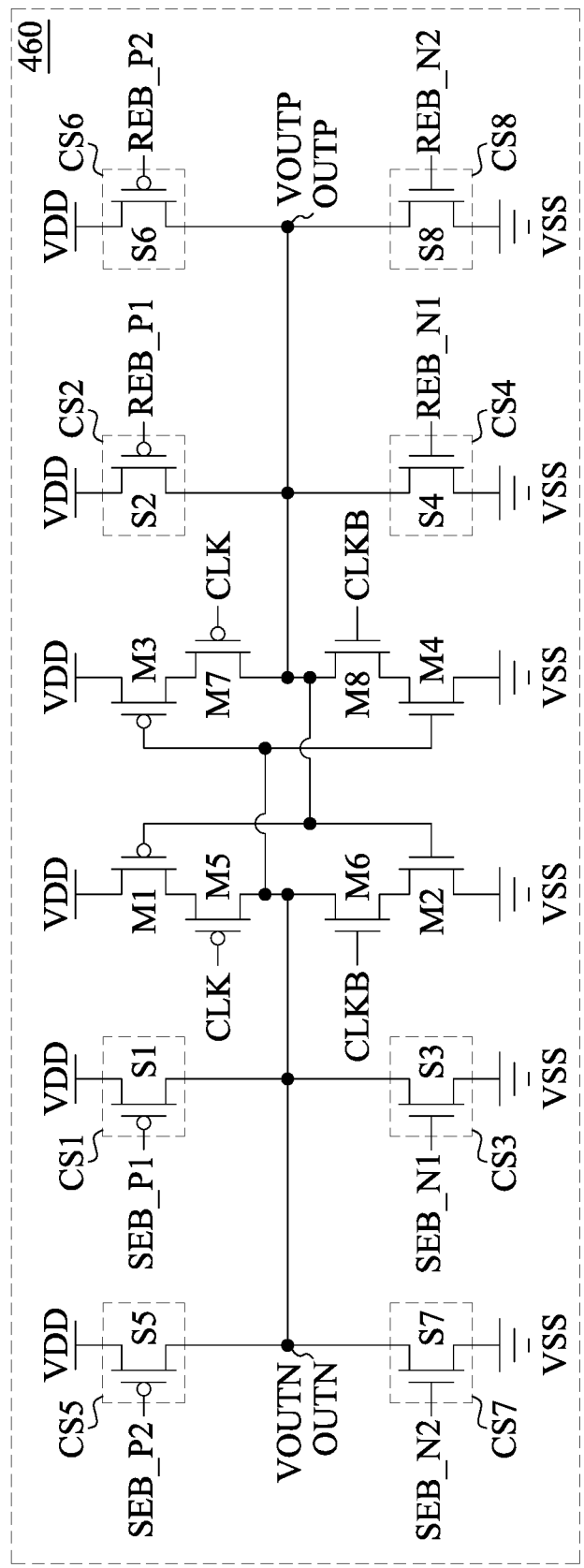
FIG. 4B is a schematic diagram illustrating a latch circuit of the sensing amplifier in FIG. 4A according to some embodiments of the present disclosure.

Reference is made to FIG. 4A and FIG. 4B. FIG. 4A is a schematic diagram illustrating two comparator circuits 420_1-420_2 and two logic circuits 440_1-440_2 of a sensing amplifier 400 according to some embodiments of the present disclosure. FIG. 4B is a schematic diagram illustrating a latch circuit 460 of the sensing amplifier 400 in FIG. 4A according to some embodiments of the present disclosure. In some embodiments, the sensing amplifier 400 can operate in a half-rate mode. When the sensing amplifier 400 operates in the half-rate mode, the clock signal CLK_O is an inversion of the clock signal CLK_E.

As illustrated in FIG. 4A and FIG. 4B, the implementations of the comparator circuit 420_1 and the logic circuit 440_1 are the same to those of the comparator circuit 220 and the logic circuit 240 in FIG. 2, so they are not described herein again.

The comparator circuit 420_2 operates according to the clock signal CLK_O, the input signal IN1, the input signal IN2, the power voltage VDD, and the ground voltage VSS to generate a comparison signal SE2 and a comparison signal RE2.

The logic circuit 440_2 is configured to generate a control signal SEB_P2, a control signal REB_P2, a control signal SEB_N2, and a control signal REB_N2 based on the clock signal CLK_E, the clock signal CLK_O, the comparison signal SE2, and the comparison signal RE2.

For example, the logic circuit 440_2 includes a logic gate L5, a logic gate L6, a logic gate L7, and a logic gate L8. The logic gate L5 and the logic gate L6 are NAND gates, and the logic gate L7 and the logic gate L8 are NOR gates. The logic gate L5 is configured to perform the NAND operation on the clock signal CLKO and the comparison signal SE2 from the comparator circuit 420_2 to generate the control signal SEB_P2. The logic gate L6 is configured to perform the NAND operation on the clock signal CLK_O and the comparison signal RE2 from the comparator circuit 420_2 to generate the control signal REB_P2. The logic gate L7 is configured to perform the NOR operation on the clock signal CLK_E and the comparison signal SE2 from the comparator circuit 420_2 to generate the control signal SEB_N2. The logic gate L8 is configured to perform the NOR operation on the clock signal CLK_E and the comparison signal RE2 from the comparator circuit 420_2 to generate the control signal REB_N2.

A major difference between the latch circuit 460 in FIG. 4B and the latch circuit 260 in FIG. 2 is that the latch circuit 460 further includes current sources CS5-CS8. The current source CS5 and the current source CS7 are coupled at the output node OUTN, and the current source CS6 and the current source CS8 are coupled at the output node OUTP. As illustrated in FIG. 4B, the current sources CS5-CS8 are implemented by switches S5-S8. The switch S5 and the switch S6 are P-type switches (e.g., P-type transistors), and the switch S7 and the switch S8 are N-type switches (e.g., N-type transistors). The switch S5 is controlled by the control signal SEB_P2 to be turned on or turned off. The switch S6 is controlled by the control signal REB_P2 to be turned on or turned off. The switch S7 is controlled by the control signal SEB_N2 to be turned on or turned off. The switch S8 is controlled by the control signal REB_N2 to be turned on or turned off.

In some embodiments, the clock signal CLK in FIG. 4B can be generated by performing OR operation on the clock signal CLK_E and the clock signal CLK_O in FIG. 4A. In addition, the inversion clock signal CLKB in FIG. 4B can be generated by performing the NOR operation on the clock signal CLK_E and the clock signal CLK_O in FIG. 4A.

Figure 5:
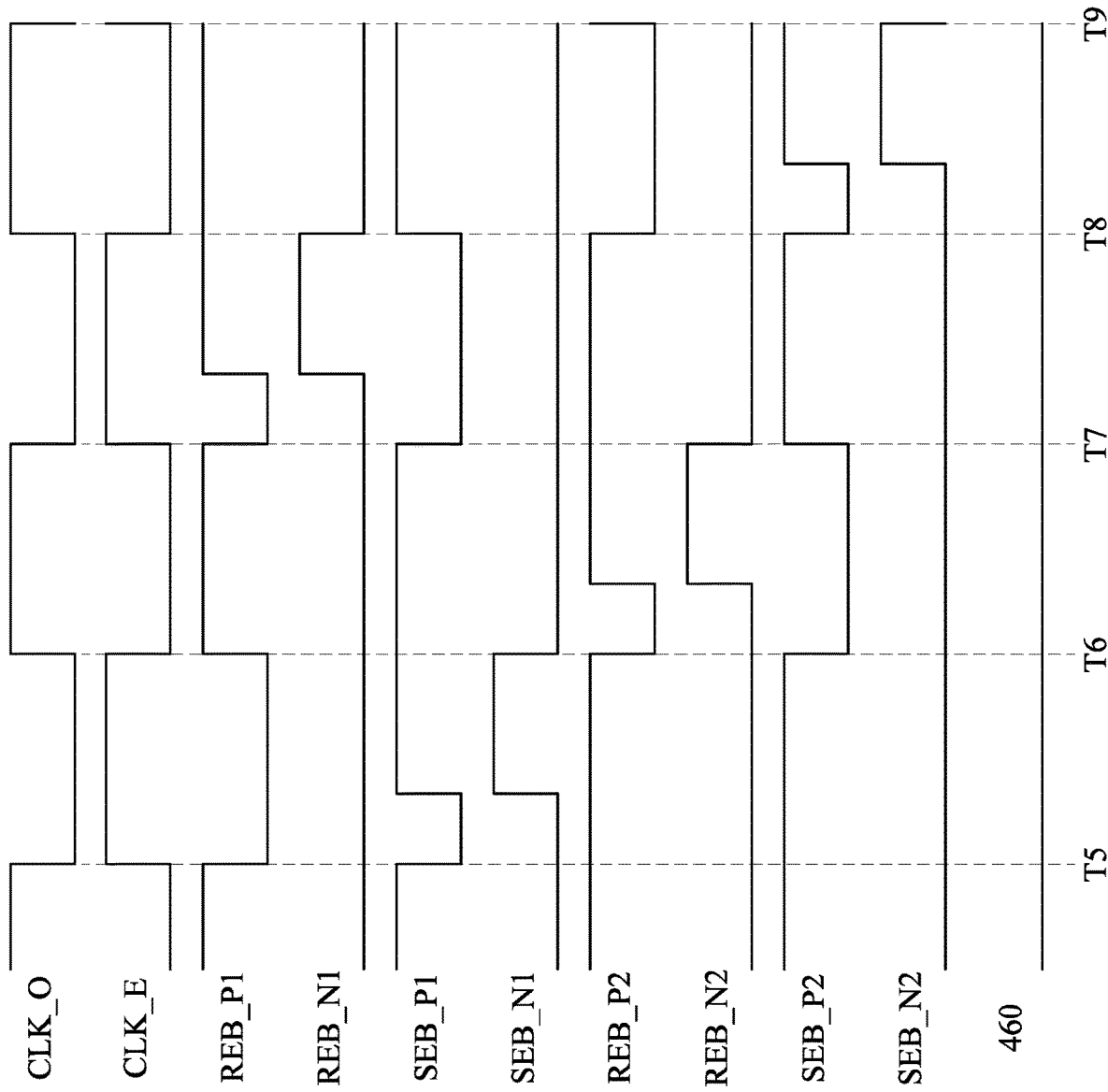
FIG. 5 is a waveform diagram illustrating signals in FIG. 4A and in FIG. 4B according to some embodiments of the present disclosure.

Reference is made to FIG. 5. FIG. 5 is a waveform diagram illustrating signals in FIG. 4A and in FIG. 4B according to some embodiments of the present disclosure.

Operations of the control signal REB_P1, the control signal REB_N1, the control signal SEB_P1, and the control signal SEB_N1 from a timing point T5 to a timing point T6 in FIG. 5 are similar to operations of the control signal REB_P1, the control signal REB_N1, the control signal SEB_P1, and the control signal SEB_N1 from the timing point T1 to the timing point T3 in FIG. 3. Operations of the control signal REB_P2, the control signal REB_N2, the control signal SEB_P2, and the control signal SEB_N2 from a timing point T8 to a timing point T9 in FIG. 5 are similar to operations of the control signal REB_P1, the control signal REB_N1, the control signal SEB_P1, and the control signal SEB_N1 from the timing point T1 to the timing point T3 in FIG. 3.

In addition, operations of the control signal REB_P1, the control signal REB_N1, the control signal SEB_P1, and the control signal SEB_N1 from a timing point T7 to the timing point T8 in FIG. 5 are similar to operations of the control signal SEB_P2, the control signal SEB_N2, the control signal REB_P2, and the control signal REB_N2 from the timing point T6 to the timing point T7 in FIG. 5.

In some related arts, a period of reset time is required before control signals for controlling some current sources can be turned off.

Compared to the aforementioned related arts, in the present disclosure, when the clock signal CLK_E drops and the clock signal CLK_O rises (e.g., the timing point T6), a voltage level of the control signal REB_P1 is pulled up immediately and a voltage level of the control signal SEB_N1 is pulled down immediately. Thus, the switch S3 of the current source CS3 and the switch S2 of the current source CS2 in FIG. 4B are turned off immediately without the reset time. In addition, when the clock signal CLK_E rises and the clock signal CLK_O drops (e.g., the timing point T7), a voltage level of the control signal REB_N2 is pulled down immediately and a voltage level of the control signal SEB_P2 is pulled up immediately. Thus, the switch S8 of the current source CS8 and the switch S5 of the current source CS5 in FIG. 4B are turned off immediately without the reset time.

Figure 6:
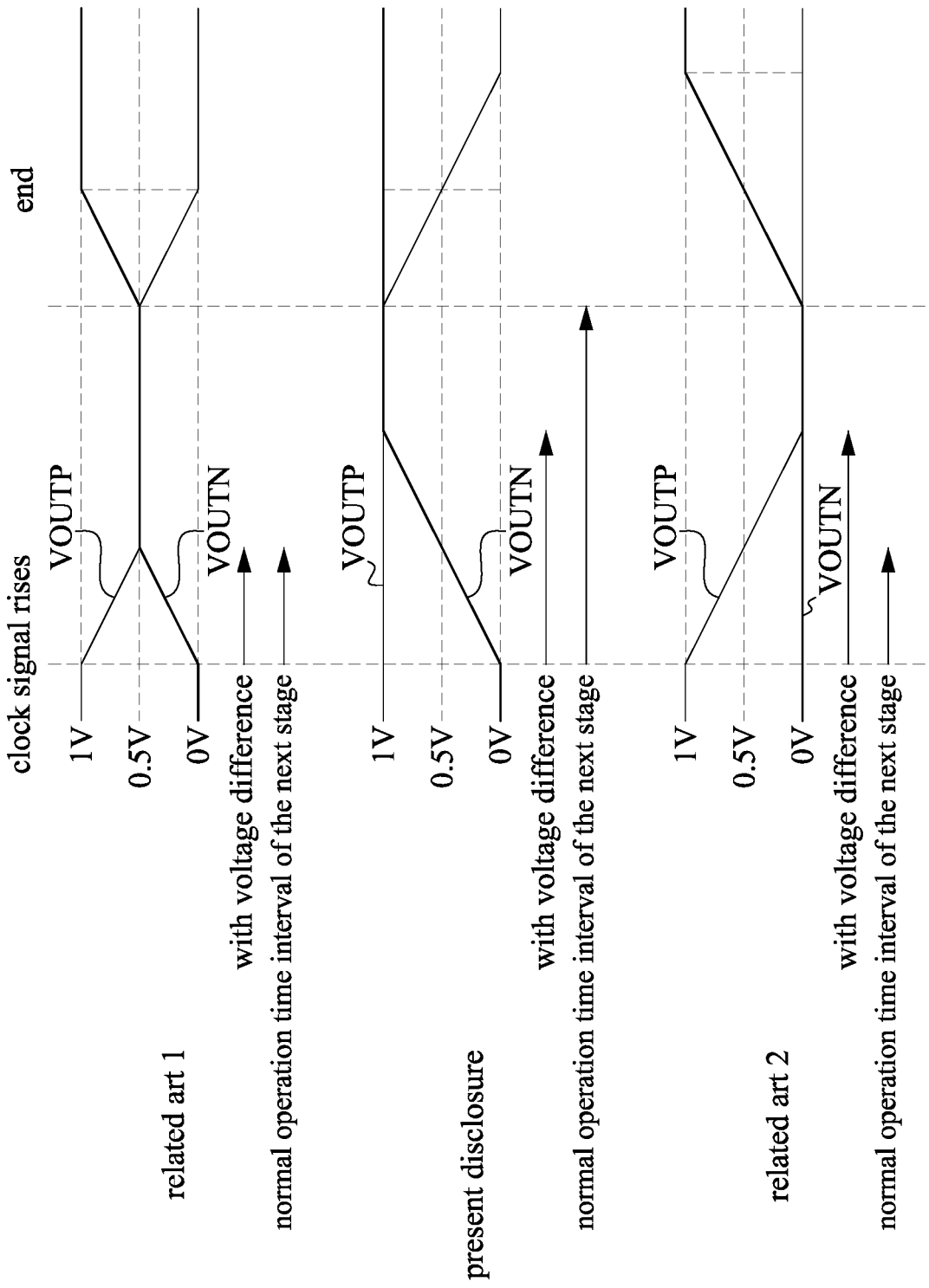
FIG. 6 is a waveform diagram illustrating two output voltages of the present disclosure and two output voltages of some related arts.

Reference is made to FIG. 6. FIG. 6 is a waveform diagram illustrating the output voltage VOUTP and the output voltage VOUTN of the present disclosure and the output voltage VOUTP and the output voltage VOUTN of some related arts.

In some embodiments, the output voltage VOUTP and the output voltage VOUTN are inputted into a sensing amplifier of the next stage, and input elements of this sensing amplifier of the next stage can be implemented by NMOS transistors. Accordingly, when the output voltage VOUTP and the output voltage VOUTN drops to 0.5 volts or less than 0.5 volts, the sensing amplifier of the next stage cannot operate correctly (the NMOS transistors are turned off). In addition, if it is assumed that the output signals have a logic value 1, the direction of charge accumulated by the sensing amplifier of the next stage is reversed when the output voltage VOUTP is less than the output voltage VOUTN. This may cause the sensing amplifier of the next stage operate incorrectly.

As illustrated in FIG. 6, in the related art 1, when the clock signal rises, the output voltage VOUTP decreases from 1 volt and the output voltage VOUTN increases from 0 volt. The normal operation time interval of the next stage is equal to the time interval when the output voltage VOUT is different from the output voltage VOUTN.

In the related art 2, when the clock signal rises, the output voltage VOUTP decreases from 1 volt and the output voltage VOUTN is kept at 0 volt. The normal operation time interval of the next stage is shorter than the time interval when the output voltage VOUT is different from the output voltage VOUTN.

In the present disclosure, as described above, when the clock signal rises and after a period of comparison time, the output voltage VOUTN is pulled down according to the ground voltage VSS and the output voltage VOUTP is pulled up according to the power voltage VDD. When the clock signal rises again, the output voltage VOUTP is kept at 1 volt and the output voltage VOUTN increases from 0 volt. Accordingly, NMOS transistors of the sensing amplifier of the next stage are turned on such that the voltage different between the output voltage VOUTP and the output voltage VOUTN can be accumulated. As illustrated in FIG. 6, in the present disclosure, the normal operation time interval of the next stage is longer than the time interval when the output voltage VOUT is different from the output voltage VOUTN. In addition, the normal operation time interval of the next stage in the present disclosure is also longer than the normal operation time intervals of the next stage in the related art 1 or in the related art 2. In addition, compared to the related art 2, an end timing point of the present disclosure is earlier.

Figure 7:
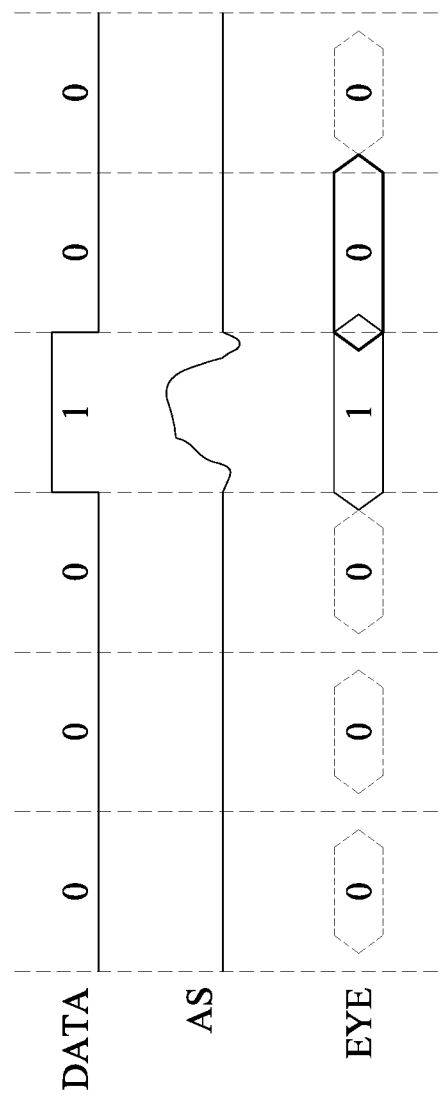
FIG. 7 is a schematic diagram illustrating data, a corresponding analog signal, and a corresponding eye diagram according to some embodiments of the present disclosure.

Reference is made to FIG. 7. FIG. 7 is a schematic diagram illustrating data DATA, a corresponding analog signal AS, and a corresponding eye diagram EYE according to some embodiments of the present disclosure. The sensing amplifier 200 in FIG. 2 is taken as an example (it is assumed that the previous output voltage VOUTP has a logic value 0 and the previous output voltage VOUTN has a logic value 1). When the clock signal CLK_E rises again and enters the comparison state, the control signal SEB_P1 and the control signal REB_P1 are pulled down to a logic value 0. Accordingly, the switch S1 and the switch S2 are turned on, and the output voltage VOUTP is pulled up. Based on the kickback noise, the output voltage VOUTP is pulled up, and thus the control signal REB_P1 and the control signal REB_N1 are pulled up (by the switch S2 and the switch S4). The rising control signal REB_P1 and control signal REB_N1 causes the comparison signal RE1 to be pulled up (by the logic gate L2 and the logic gate L4). When the comparison signal RE1 is pulled up, the comparison signal SE1 generated by the comparator circuit 220 approaches a logic value 0 and the comparison signal RE1 approaches a logic value 1. When the comparison signal SE1 approaches a logic value 0 and the comparison signal RE1 approaches a logic value 1, the control signal SEB_P1 outputted by the logic gate L1 and the control signal SEB_N1 outputted by the logic gate L3 approach a logic value 1, and the control signal REB_P1 outputted by the logic gate L2 and the control signal REB_N1 outputted by the logic gate L4 approach a logic value 0. Thus, it is easier to turn on the switch S2 and the switch S3 such that the output voltage VOUTP approaches a logic value 1 and the output voltage VOUTN approaches a logic value 0. Thus, it is easier to make the current output data to be the inversion of the previous output data (the output voltage VOUTP of the previous output data has a logic value 0, and the output voltage VOUTN of the previous output data has a logic value 1). Accordingly, the width corresponding to the transition region of the eye diagram EYE can be wider to improve recognizability of the eye diagram EYE.

Based on the descriptions above, the present disclosure can prevent the latch circuit from generating the short current during signal transitions. In addition, the sensing amplifier can improve performance by using kickback noise. Accordingly, the latch circuit and the sensing amplifier of the present disclosure have better performance.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A latch circuit, comprising:
a first current source;
a second current source;
a third current source;
a fourth current source, wherein the first current source and the third current source are coupled at a first output node, and the second current source and the fourth current source are coupled at a second output node;
a first transistor and a second transistor, wherein a control terminal of the first transistor and a control terminal of the second transistor are coupled to the second output node;
a third transistor and a fourth transistor, wherein a control terminal of the third transistor and a control terminal of the fourth transistor are coupled to the first output node;
a fifth transistor and a sixth transistor, wherein the first transistor and the fifth transistor are coupled in series between a power terminal and the first output node, wherein the sixth transistor and the second transistor are coupled in series between the first output node and a ground terminal; and
a seventh transistor and an eighth transistor, wherein the third transistor and the seventh transistor are coupled in series between the power terminal and the second output node, wherein the eighth transistor and the fourth transistor are coupled in series between the second output node and the ground terminal,
wherein the fifth transistor, the sixth transistor, the seventh transistor, and the eighth transistor are turned on or turned off based on a clock signal,
wherein the fifth transistor is configured to receive the clock signal, the sixth transistor is configured to receive an inversion clock signal corresponding to the clock signal,
wherein the first current source receives a control signal and is controlled by the received control signal,
wherein the control signal is generated by performing a logical operation on the clock signal and a comparison signal,
wherein the comparison signal is generated by a comparator circuit according a plurality of input signals and the clock signal.

2. The latch circuit of claim 1, wherein the first transistor and the fifth transistor are P-type transistors, and the second transistor and the sixth transistor are N-type transistors.

3. The latch circuit of claim 1, wherein the seventh transistor is configured to receive the clock signal, and the eighth transistor is configured to receive the inversion clock signal.

4. The latch circuit of claim 3, wherein the third transistor and the seventh transistor are P-type transistors, and the fourth transistor and the eighth transistor are N-type transistors.

5. A sensing amplifier, comprising:
a first comparator circuit configured to generate a first comparison signal and a second comparison signal according a first input signal, a second input signal, and a first clock signal;
a logic circuit configured to generate a first control signal, a second control signal, a third control signal, and a fourth control signal based on the first clock signal, the first comparison signal, and the second comparison signal; and
a latch circuit comprising:
a first current source;
a second current source;
a third current source;
a fourth current source, wherein the first current source and the third current source are coupled at a first output node, wherein the first control signal is configured to control the first current source, and the third control signal is configured to control the third current source, wherein the second current source and the fourth current source are coupled at a second output node, wherein the second control signal is configured to control the second current source, and the fourth control signal is configured to control the fourth current source;
a first transistor and a second transistor, wherein a control terminal of the first transistor and a control terminal of the second transistor are coupled to the second output node; and
a third transistor and a fourth transistor, wherein a control terminal of the third transistor and a control terminal of the fourth transistor are coupled to the first output node.

6. The sensing amplifier of claim 5, wherein when the first clock signal has a first logic value, the first comparator circuit is in a reset state, wherein when the first clock signal has a second logic value, the first comparator circuit is in a comparison state and is configured to compare the first input signal and the second input signal to generate the first comparison signal and the second comparison signal.

7. The sensing amplifier of claim 6, wherein the logic circuit comprises:
a first logic gate configured to generate the first control signal according to the first clock signal and the first comparison signal;
a second logic gate configured to generate the second control signal according to the first clock signal and the second comparison signal;
a third logic gate configured to generate the third control signal according to the first comparison signal; and
a fourth logic gate configured to generate the fourth control signal according to the second comparison signal.

8. The sensing amplifier of claim 7, wherein the third logic gate is further configured to generate the third control signal according to a second clock signal and the first comparison signal, wherein the fourth logic gate is further configured to generate the fourth control signal according to the second clock signal and the second comparison signal.

9. The sensing amplifier of claim 8, wherein the first logic gate and the second logic gate are NAND gates, and the third logic gate and the fourth logic gate are NOR gates.

10. The sensing amplifier of claim 8, wherein each of the first current source and the second current source comprises a P-type switch, and the P-type switches are turned on or turned off according to the first control signal and the second control signal respectively, wherein each of the third current source and the fourth current source comprises a N-type switch, and the N-type switches are turned on or turned off according to the third control signal and the fourth control signal respectively.

11. The sensing amplifier of claim 8, wherein when the sensing amplifier operates in a full-rate mode, the second clock signal has the first logic value.

12. The sensing amplifier of claim 8, further comprising:
a second comparator circuit configured to generate a third comparison signal and a fourth comparison signal according to the first input signal, the second input signal, and the second clock signal, wherein the logic circuit is further configured to generate a fifth control signal, a sixth control signal, a seventh control signal, and an eighth control signal based on the first clock signal, the second clock signal, the third comparison signal, and the fourth comparison signal,
wherein the latch circuit further comprises:
a fifth current source;
a sixth current source;
a seventh current source; and
a eighth current source, wherein the fifth current source and the seventh current source are coupled at the first output node, wherein the fifth control signal is configured to control the fifth current source, and the seventh control signal is configured to control the seventh current source, wherein the sixth current source and the eighth current source are coupled at the second output node, wherein the sixth control signal is configured to control the sixth current source, and the eighth control signal is configured to control the eighth current source.

13. The sensing amplifier of claim 12, wherein the logic circuit further comprises:
a fifth logic gate configured to generate the fifth control signal according to the second clock signal and the third comparison signal;
a sixth logic gate configured to generate the sixth control signal according to the second clock signal and the fourth comparison signal;
a seventh logic gate configured to generate the seventh control signal according to the first clock signal and the third comparison signal; and
an eighth logic gate configured to generate the eighth control signal according to the first clock signal and the fourth comparison signal.

14. The sensing amplifier of claim 13, wherein the fifth logic gate and the sixth logic gate are NAND gates.

15. The sensing amplifier of claim 13, wherein the seventh logic gate and the eighth logic gate are NOR gates.

16. The sensing amplifier of claim 12, where when the sensing amplifier operates in a half-rate mode, the second clock signal is an inversion of the first clock signal.

17. The sensing amplifier of claim 5, wherein the latch circuit further comprises:
a fifth transistor and a sixth transistor, wherein the first transistor and the fifth transistor are coupled in series between a power terminal and the first output node, wherein the sixth transistor and the second transistor are coupled in series between the first output node and a ground terminal; and
a seventh transistor and an eighth transistor, wherein the third transistor and the seventh transistor are coupled in series between the power terminal and the second output node, wherein the eighth transistor and the fourth transistor are coupled in series between the second output node and the ground terminal,
wherein the fifth transistor, the sixth transistor, the seventh transistor, and the eighth transistor are turned on or turned off based on the first clock signal.

* * * * *